United States Patent
Liu

(10) Patent No.: US 9,685,382 B1
(45) Date of Patent: Jun. 20, 2017

(54) METHOD FOR REDUCING LOSS OF SILICON CAP LAYER OVER SIGE SOURCE/DRAIN IN A CMOS DEVICE

(71) Applicants: Semiconductor Manufacturing International (Shanghai) Corporation, Shanghai (CN); Semiconductor Manufacturing International (Beijing) Corporation, Beijing (CN)

(72) Inventor: Jialei Liu, Shanghai (CN)

(73) Assignees: Semiconductor Manufacturing International (Shanghai) Corporation, Shanghai (CN); Semiconductor Manufacturing International (Beijing) Corporation, Beijing (CN)

( * ) Notice: Subject to any disclaimer, the term of this patent is extended or adjusted under 35 U.S.C. 154(b) by 0 days.

(21) Appl. No.: 15/222,624

(22) Filed: Jul. 28, 2016

(30) Foreign Application Priority Data

Dec. 15, 2015 (CN) .......................... 2015 1 0939766

(51) Int. Cl.
| | | |
|---|---|---|
| *H01L 21/8238* | (2006.01) | |
| *H01L 27/092* | (2006.01) | |
| *H01L 29/08* | (2006.01) | |
| *H01L 29/161* | (2006.01) | |
| *H01L 29/165* | (2006.01) | |
| *H01L 29/78* | (2006.01) | |

(52) U.S. Cl.
CPC ............ *H01L 21/823814* (2013.01); *H01L 21/823864* (2013.01); *H01L 27/092* (2013.01); *H01L 29/0847* (2013.01); *H01L 29/161* (2013.01); *H01L 29/165* (2013.01); *H01L 29/7848* (2013.01)

(58) Field of Classification Search
CPC ..... H01L 21/823814; H01L 21/823864; H01L 27/092; H01L 29/0847; H01L 29/161; H01L 29/165; H01L 29/7848
USPC ........................................................ 438/230
See application file for complete search history.

(56) References Cited

U.S. PATENT DOCUMENTS

| 9,385,124 B1 * | 7/2016 | Peng ............... H01L 21/823828 |
| 2008/0124922 A1 | 5/2008 | Kawamura et al. |
| 2011/0070701 A1 | 3/2011 | Ning et al. |

(Continued)

OTHER PUBLICATIONS

European Application No. 16202837, Extended European Search Report mailed on Apr. 18, 2017, 10 pages.

*Primary Examiner* — Yasser A Abdelaziez
(74) *Attorney, Agent, or Firm* — Kilpatrick Townsend and Stockton LLP

(57) ABSTRACT

A method for forming a semiconductor device includes providing a semiconductor substrate including a PMOS region and an NMOS region. A spacer material layer is deposited. Then, a first photo masking and etch process is used to form first sidewall spacers on the sidewalls of the gate structures in the NMOS region. A sacrificial surface layer is formed. Next, a second photo masking and etch process is used to form second sidewall spacers on the sidewalls of the gate structures in the PMOS region. After the second photoresist layer is removed, with the sacrificial layer masking the NMOS region, stress layers are formed in source/drain regions in the PMOS region, and a cover layer is formed on the stress layers. The method further includes removing the sacrificial material layer, the first sidewall spacers, and the second sidewall spacer.

20 Claims, 5 Drawing Sheets

(56) References Cited

U.S. PATENT DOCUMENTS

| | | | |
|---|---|---|---|
| 2011/0201166 A1 | 8/2011 | Chung et al. | |
| 2011/0309452 A1* | 12/2011 | Jeong | H01L 21/0217 257/369 |
| 2012/0094448 A1* | 4/2012 | Yeh | H01L 21/823807 438/231 |
| 2012/0094459 A1* | 4/2012 | Park | H01L 21/02068 438/299 |
| 2012/0241868 A1* | 9/2012 | Tsai | H01L 21/823807 257/369 |

* cited by examiner

METHOD FOR REDUCING LOSS OF SILICON CAP LAYER OVER SIGE SOURCE/DRAIN IN A CMOS DEVICE

CROSS-REFERENCES TO RELATED APPLICATIONS

This application claims priority to Chinese patent application No. 201510939766.0, filed on Dec. 15, 2015, the content of which is incorporated herein by reference in its entirety.

BACKGROUND OF THE INVENTION

The present invention relates to the field of semiconductor technology. Specifically, embodiments of the invention relate to semiconductor device structures and manufacturing methods.

The embedded silicon germanium (Embedded SiGe, or E-SiGe) process is widely used in advanced CMOS process technology to introduce compressive stress in the channel region, thus significantly improving the performance of PMOS. However, the inventor has observed that E-SiGe technology faces many challenges, including in unit processing (e.g., achieving high Ge content percentage, defect control, etc.) and integration issues (e.g., stress control, embedded SiGe shape, thermal compatibility, etc.).

In advanced CMOS processes, Σ type SiGe sources/drains are used to produce additional compressive stress to the channel in order to improve hole mobility. FIGS. 1A-1C illustrate a conventional process. FIG. 1A shows a substrate having an NMOS region and a PMOS region. A SiGe layer 101 is formed in the source/drain in the PMOS region. A Si cap layer 102 is formed on top of SiGe layer 101 to protect the layer of SiGe 101. As shown in FIG. 1B, dry etching is performed in the NMOS device regions to form spacer nitride (SiN) 103. Additionally, an ashing process is used to remove the photoresist in the PMOS region. These processes can cause loss of Si cap layer 102, which is exposed to plasma generated during dry etching and oxidation. During the subsequent process, Si cap layer 102 can suffer damages and losses such that SiGe layer 101 is not well protected, as shown in FIG. 1C.

Thus, an improved process for a SiGe source/drain is desired.

BRIEF SUMMARY OF THE INVENTION

Embodiments of the present invention provide a method for forming a CMOS device having SiGe stressed source/drain regions. In embodiments of this invention, the SiGe stress layers in the PMOS regions and the cover layer are formed after the NMOS device region has already been formed, and the subsequent removal of the sacrificial layer and the spacers is carried out by wet etching. This method can effectively avoid the overlay loss caused by a dry etching process that fails to protect the SiGe stress layer. It can ensure the integrity of the SiGe stress layer to provide compression stress in the channel to improve carrier mobility, and ultimately improve the yield and performance of the device.

According to some embodiments of the present invention, a method for forming a semiconductor device includes providing a semiconductor substrate, which includes a PMOS region and an NMOS region, and a plurality of gate structures formed in the PMOS region and the NMOS region. The method includes depositing a spacer material layer overlying the plurality of gate structures and the surface of the semiconductor substrate, forming a first photoresist layer to cover the PMOS region and to expose the NMOS region, etching the exposed portion of the spacer material layer to form first sidewall spacers on the sidewalls of the gate structures in the NMOS region, and removing the first photoresist layer. The method also includes depositing a sacrificial surface layer overlying the spacer material layer covering the PMOS region, the first sidewall spacers, and the exposed surface of the semiconductor substrate. Next, a second photoresist layer is formed to cover the NMOS region and to expose the PMOS region. The sacrificial material layer and the spacer material layer are etched in the exposed PMOS region to form second sidewall spacers on the sidewalls of the gate structure in the PMOS region. After removing the second photoresist layer, the method includes forming stress layers in source/drain regions in the PMOS region and forming a cover layer on the stress layers. The method further includes removing the sacrificial material layer, the first sidewall spacers, and the second sidewall spacer.

In an embodiment of the above method, the cover layer is not subject to plasma etching during removal of the sacrificial material layer, the first sidewall spacers, and the second sidewall spacer.

In an embodiment, each of the gate structures comprises a gate dielectric layer and a gate electrode layer.

In an embodiment, the spacer material layer comprises a nitride layer and an oxide layer. In an embodiment, the nitride layer includes silicon nitride, and the oxide layer comprises silicon oxide. In an embodiment, depositing the spacer material layer includes a process selected from the group consisting of high temperature furnace deposition, chemical vapor deposition, physical vapor deposition, and atomic layer deposition. In an embodiment, the nitride layer is deposited in a temperature range of 100° C. to 600° C. In an embodiment, the nitride layer is disposed over the oxide layer. In an embodiment, the thickness of the oxide layer ranges from 10 to 50 Å, and the thickness of the nitride layer ranges from 50 to 200 Å. In an embodiment, etching the exposed portion of the spacer material layer comprises using a dry etch process to etch the nitride layer to stop at the oxide layer, and using a wet etch process to etch a portion of the oxide layer. In an embodiment, the wet etch process comprises using dilute hydrofluoric acid etching solution having a molar concentration ranging from 0.01 to 1%.

In an embodiment, the sacrificial layer and the spacer material layer include the same material.

In an embodiment, removing the sacrificial material layer, the first sidewall spacers, and the second sidewall spacer includes using a wet etch process such that the cover layer is not exposed to dry etching. In an embodiment, the method also includes using phosphoric acid solution to remove the remaining portion of the sacrificial material layer, the first spacers, and the second spacers at a reaction temperature ranging from 100° C. to 200° C.

In an embodiment, the method further includes, before depositing the spacer material layer, forming a gate offset structure on the sidewalls of the gate and forming a gate hard mask on the top surface of the gate structure.

In an embodiment, the stress layer includes silicon germanium.

In an embodiment, the cover layer includes silicon.

In an embodiment, the sacrificial layer is deposited at a temperature of 100° C. to 600° C. and a thickness of 50 to 200 Å.

According to another embodiment, a method for manufacturing a semiconductor device includes providing a semiconductor substrate, the semiconductor substrate including a PMOS region and an NMOS region, and a plurality of gate structures formed in the PMOS region and the NMOS region. The method includes depositing a spacer material layer overlying the plurality of gate structures and the surface of the semiconductor substrate, forming a first photoresist layer to cover the PMOS region and to expose the NMOS region, etching the exposed portion of the spacer material layer to form first sidewall spacers on the sidewalls of the gate structures in the NMOS region, and removing the first photoresist layer. The method also includes depositing a sacrificial surface layer overlying the spacer material layer that covers the PMOS region, the first sidewall spacers, and the exposed surface of the semiconductor substrate. The method also includes forming a second photoresist layer to cover the NMOS region and to expose the PMOS region, etching the sacrificial material layer and the spacer material layer in the exposed PMOS region to form second sidewall spacers on the sidewalls of the gate structure in the PMOS region, and removing the second photoresist layer. The method also includes forming stress layers in source/drain regions in the PMOS region and forming a cover layer on the stress layers. The method also includes removing the sacrificial material layer, the first sidewall spacers, and the second sidewall spacer using a wet etch process such that the cover layer is not exposed to dry etching.

In an embodiment, the method also includes using phosphoric acid solution to a remove remaining portion of the sacrificial material layer, the first spacers, and the second spacers at a reaction temperature ranging from 100° C. to 200° C.

In an embodiment, the stress layer comprises silicon germanium.

The following description, together with the accompanying drawings, will provide further understanding of the nature and advantages of the claimed invention.

DETAILED DESCRIPTION OF THE INVENTION

Figure 1A:
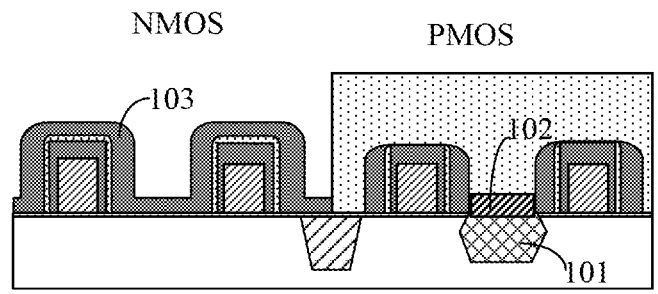
FIGS. 1A-1C are cross-sectional diagrams illustrating a conventional process for making a CMOS device.
Figure 1B:
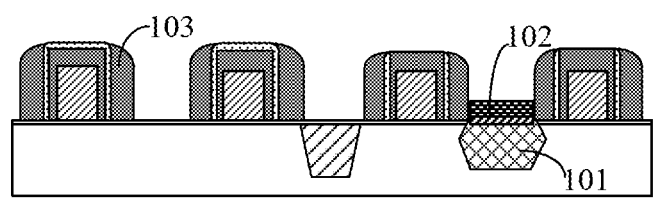
Figure 1C:
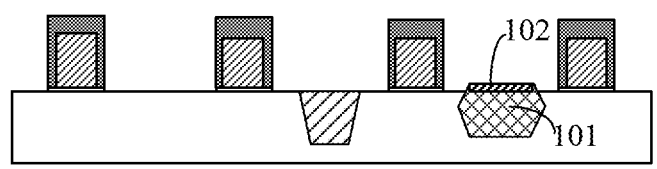

Embodiments of the present invention provide an isolation structure, its manufacturing method, and related electronic devices.

In the following description, numerous specific details are provided for a thorough understanding of the present invention. However, it should be appreciated by those of skill in the art that the present invention may be realized without one or more of these details. In other examples, features and techniques known in the art will not be described for purposes of brevity.

It should be understood that the drawings are not drawn to scale, and similar reference numbers are used for representing similar elements. Embodiments of the invention are described herein with reference to cross-section illustrations that are schematic illustrations of idealized embodiments (and intermediate structures) of the invention. The thickness of layers and regions in the drawings may be exaggerated relative to each other for clarity. Additionally, variations in the illustrated shapes resulting, for example, from manufacturing techniques and/or tolerances, are to be expected. Thus, embodiments of the invention should not be construed as limited to the particular shapes of regions illustrated herein but are to include deviations in shapes that result, for example, from manufacturing.

It will be understood that, when an element or layer is referred to as "on," "disposed on," "adjacent to," "connected to," or "coupled to" another element or layer, it can be disposed directly on the other element or layer, adjacent to, connected or coupled to the other element or layer, or intervening elements or layers may also be present. In contrast, when an element is referred to as being "directly on," directly disposed on, " "directly connected to," or "directly coupled to" another element or layer, there are no intervening elements or layers present between them. It will be understood that, although the terms "first," "second," "third," etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Relative terms, or spatial relationship terms, such as "under," "below," "underneath," "over," "on," "above," "bottom," and "top" are used herein to describe a relationship of one element, layer or region to another element, layer or region as illustrated in the figures. It will be understood that these terms are intended to encompass different orientations of the structure in addition to the orientation depicted in the figures. For example, if the device shown in the figures is flipped, the description of an element being "below" or "underneath" another element would then be oriented as "above" the other element. Therefore, the term "below," "under," or "underneath" can encompass both orientations of the device. Because devices or components of embodiments of the present invention can be positioned in a number of different orientations (e.g., rotated 90 degrees or at other orientations), the relative terms should be interpreted accordingly.

The terms "a," "an," and "the" may include singular and plural references. It will be further understood that the terms "comprising," "including," "having" and variants thereof, when used in this specification, specify the presence of stated features, steps, operations, elements, and/or components, but do not preclude the presence or addition of one or more other features, steps, operations, elements, components, and/or groups thereof. Furthermore, as used herein, the words "and/or" may refer to and encompass any possible combinations of one or more of the associated listed items.

The use of the terms "first," "second," etc. do not denote any order, but rather the terms "first," "second," etc. are used to distinguish one element from another. Furthermore, the use of the terms "a," "an," etc. does not denote a limitation of quantity, but rather denote the presence of at least one of the referenced items.

The term "vertical" as used in this application is defined as a plane perpendicular to the conventional plane or surface of a wafer or substrate, regardless of the orientation of the wafer or substrate. The term "horizontal" refers to a direction perpendicular to the vertical as defined above.

Embodiments of the invention are described herein with reference to cross-section illustrations that are schematic illustrations of idealized embodiments (and intermediate structures) of the invention. For example, an implanted region illustrated as a rectangle will, typically, have rounded or curved features and/or a gradient of implant concentration at its edges rather than a discrete change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

Prepositions, such as "on," "side" (as in "sidewall"), "below," "above," "higher," "lower," "over," and "under" are defined with respect to the conventional plane or surface being on the top surface of the wafer or substrate, regardless of the orientation of the wafer or substrate. It will be understood that these terms are intended to encompass different orientations of the device in addition to the orientation depicted in the figures.

The description below is presented with reference to a series of drawing figures enumerated above. These diagrams are merely examples, and should not unduly limit the scope of the claims herein. In connection with the various aspects illustrated and described, one of ordinary skill in the art would recognize other variations, modifications, and alternatives.

Figure 2A:
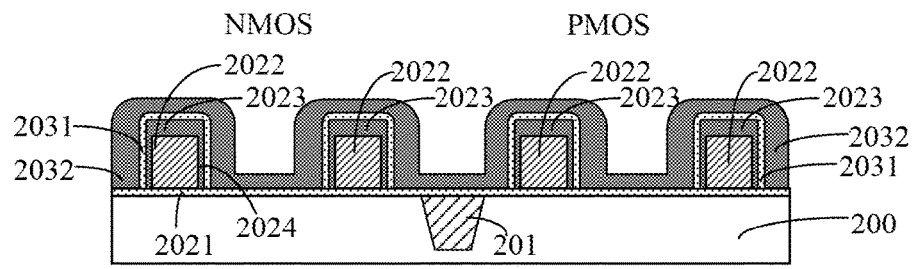
FIGS. 2A-2H are cross-sectional diagrams illustrating a process for making a CMOS device according to an embodiment of the present invention.
Figure 2B:
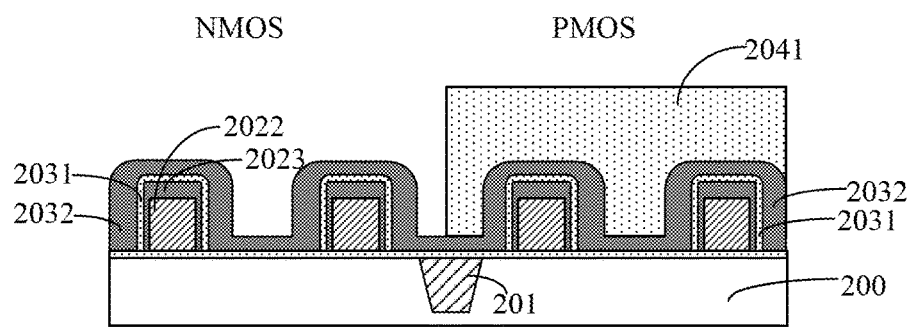
Figure 2C:
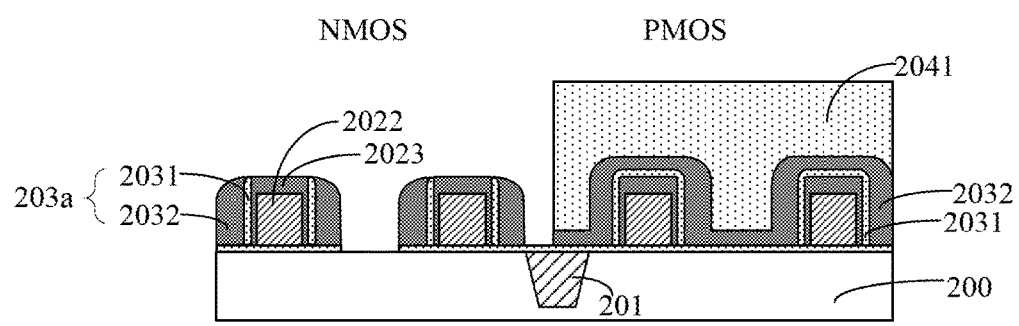
Figure 2D:
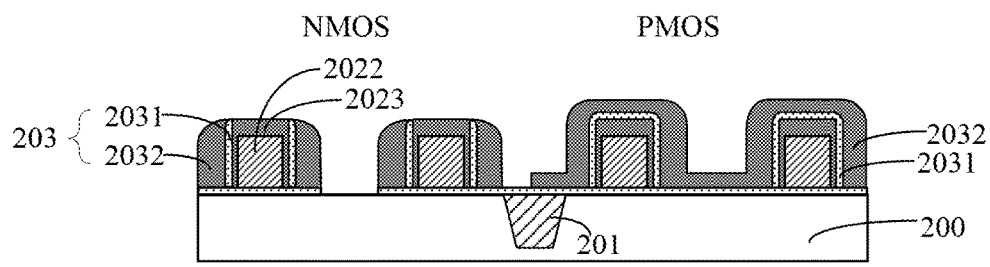

FIGS. 2A-2H are cross-sectional diagrams illustrating a method for forming a semiconductor device according to an embodiment of the present invention. FIG. 3 is a flowchart illustrating the method.

With reference to the flowchart in FIG. 3, the method can be summarized below.

Step S301: providing a semiconductor substrate, including a PMOS region and an NMOS region, and a plurality of gate structures forming in the PMOS region and the NMOS region;

Step S302: depositing a spacer material layer overlying the plurality of gate structures and the surface of the semiconductor substrate;

Step S303: forming a first photoresist layer to cover the PMOS region and to expose the NMOS region;

Step S304: etching the exposed portion of the spacer material layer to form first sidewall spacers on the sidewalls of the gate structures in the NMOS region;

Step S305: removing the first photoresist layer;

Step S306: depositing a sacrificial surface layer, the sacrificial layer overlying the spacer material layer covering the remainder of the material, the first sidewall spacers, and the exposed surface of the semiconductor substrate;

Step S307: forming a second photoresist layer to cover the NMOS region and to expose the PMOS region; etching the sacrificial material layer and the spacer material layer in the exposed PMOS region to form second sidewall spacers on the sidewalls of the gate structure in the PMOS region;

Step S308: removing the second photoresist layer; forming stress layers in source/drain regions in the PMOS region; forming a cover layer on the stress layers;

Step S309: removing the sacrificial material layer, the first sidewall spacers, and the second sidewall spacer.

With reference to the cross-sectional diagrams in FIGS. 2A-2H, the method is described in more detail below.

At step S301, the method includes providing a semiconductor substrate, including a PMOS region and an NMOS region, and a plurality of gate structures forming in the PMOS region and the NMOS region. FIG. 2A shows a semiconductor substrate 200 that includes an NMOS region and a PMOS region separated by an isolation region 201. Semiconductor substrate 200 can include undoped single crystalline silicon, single crystalline silicon doped with impurities, silicon on insulator (SOI), silicon-on-insulator laminate (SSOI), laminated silicon germanium-on-insulator (S—SiGeOI), silicon germanium-on-insulator (SiGeOI), and germanium-on-insulator (GeOI), and the like. As an example, in the present embodiment, semiconductor substrate 200 includes monocrystalline silicon material. Isolation structure 201 can be a shallow trench isolation (STI) structure or local oxidation of silicon (LOCOS) isolation structure. In this example, a shallow trench isolation 201 is formed in semiconductor substrate 200. The semiconductor substrate 200 can also include various well structures, which are omitted in order to simplify the illustration.

Various NMOS and PMOS devices can be formed in the NMOS and PMOS regions, including gate structures. For example, as shown in FIG. 2A, the gate structures can include gate dielectric layers 2021 and gate layers 2022. For example, gate dielectric layer 2021 may be silicon oxide ($SiO2$) or silicon oxynitride (SiON). In one embodiment, the gate layer 2022 can be a polysilicon material, or a metal, metal nitride, metal silicide compounds or the like. Gate dielectric layer 2021 and gate layer 2022 can be formed using chemical vapor deposition (CVD), such as low temperature chemical vapor deposition (LTCVD), low pressure chemical vapor deposition (LPCVD), rapid thermal chemical vapor deposition (LTCVD), plasma chemical vapor deposition (PECVD), sputtering, and physical vapor deposition (PVD) methods, etc.

In this example, offset spacers 2024 are formed on the sidewalls of the gate structure. The materials of the sidewall 2024 can be, for example, silicon nitride, silicon oxide, or silicon oxynitride insulating material. Further, gate hard mask layers 2023 are formed on the top surface of the gate structure. The gate hard mask material layer 2023 may be silicon nitride, silicon oxide, or oxynitride, or the like. The gate hard mask may also have the same material as offset sidewall spacers 2024.

At step S302, the method includes depositing a spacer material layer overlying the plurality of gate structures and the surface of the semiconductor substrate. The spacer material layer may be silicon oxide, silicon nitride, silicon oxynitride, or a combination thereof. As shown in FIG. 2A, the spacer material layer includes silicon oxide 2031 and silicon nitride 2032 overlying the silicon oxide. The deposition of the spacer material layer can use a process selected from the group consisting of high temperature furnace process, chemical vapor deposition, physical vapor deposition, and atomic layer deposition, etc. The high temperature furnace process can include high temperature oxidation or nitridation. The nitride layer can be deposited in a temperature range of 100° C. to 600° C. The thickness of the oxide layer can range from 10 to 50 Å, and the thickness of the nitride layer can range from 50 to 200 Å.

At step S303, the method includes forming a first photoresist layer to cover the PMOS region and to expose the NMOS region. As shown in FIG. 2B, a first photoresist layer 2041 overlies the PMOS region and exposes the NMOS region. The first photoresist layer can be formed using coating, exposure, development, and other steps.

At step S304, the method includes etching the exposed portion of the spacer material layer to form first sidewall spacers 203a on the sidewalls of the gate structures in the NMOS region. As shown in FIG. 2C, the spacer material layer includes sequentially stacked silicon oxide 2031 and silicon nitride 2032. A dry etch process is used to etch the nitride layer to stop at the oxide layer, and a wet etch process is used to etch a portion of the oxide layer. The dry etching is anisotropic etching, and can include etch processes such as reactive ion etching, ion beam etching, plasma etching, or laser ablation, etc. The dry etch is a single etching method described above, or a combination of more than one etching method. In one example, the wet etch can use dilute hydrofluoric acid etching solution, at a molar concentration of said hydrofluoric of from 0.01 to 1%.

In this embodiment, after the etching step, the first spacer 203a is formed on the NMOS gate structure side wall region, and the surface of the semiconductor substrate 200 between the NMOS gates is exposed. In some cases, gate dielectric layer 2021 between the NMOS gates is removed.

Next, at step S305, the first photoresist layer is removed. As shown in FIG. 2D, first photoresist layer 2041 is removed, using any method known to those skilled artisan, e.g., ashing, and the like.

Figure 2E:
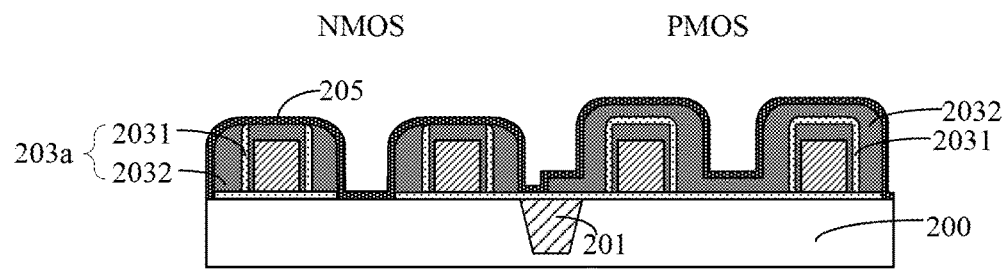
Figure 3:
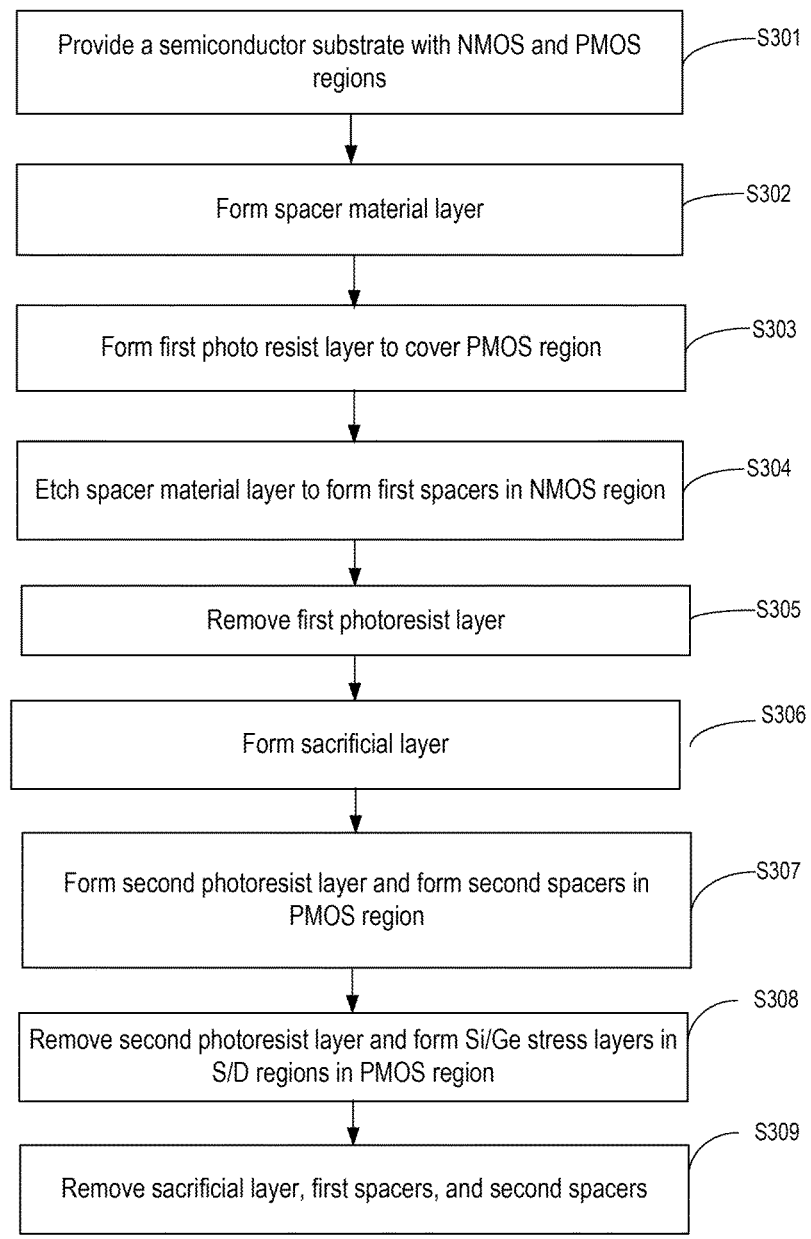
FIG. 3 is a flowchart illustrating a process for making a CMOS device according to an embodiment of the present invention.

At step S306, as shown in FIG. 2E, a sacrificial surface layer 205 is deposited overlying the spacer material layer, the first sidewall spacers 203a, and the exposed surface of the semiconductor substrate 200. Sacrificial material layer 205, for example, can be formed with silicon nitride, silicon oxide, or silicon oxynitride insulating material. Sacrificial material layer 205 and the outer layer material of the spacer material layer can have the same material. For example, if the spacer material layer includes sequentially deposited silicon oxide nitride 2031 and 2032, then the sacrificial material layer 205 may be silicon nitride. Sacrificial layer 205 may be deposited using a known method, e.g., formation in high temperature furnace, chemical vapor deposition (CVD), physical vapor deposition (PVD), or atomic layer deposition (ALD). Sacrificial material layer 205 can be deposited at a deposition temperature ranging from 100° C. to 600° C., and the thickness of the sacrificial material layer can range from 50 to 200 Å.

Figure 2F:
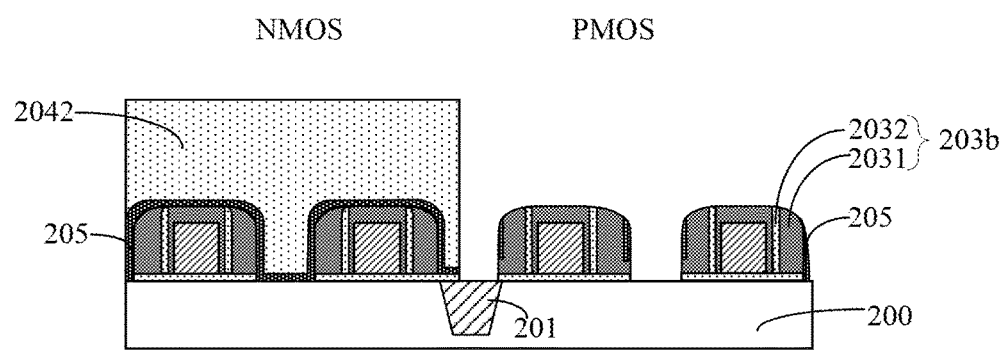

At step S307, as shown in FIG. 2F, a second photoresist layer 2042 is formed to cover the NMOS region and to expose the PMOS region. The sacrificial material layer and the spacer materials layer in the exposed PMOS region are etched to form second sidewall spacers 203b on the sidewalls of the gate structures in the PMOS region.

As shown in FIG. 2F, the spacer material layer includes sequentially stacked silicon oxide 2031 and silicon nitride 2032. A dry etch process is used to etch the nitride layer to stop at the oxide layer, and a wet etch process is used to etch a portion of the oxide layer. The dry etching is anisotropic etching, and can include etch processes such as reactive ion etching, ion beam etching, plasma etching, or laser ablation, etc. The dry etch is a single etching method described above, or a combination of more than one etching method. In one example, the wet etch can use diluted hydrofluoric acid etching solution, at a molar concentration of said hydrofluoric of from 0.01 to 1%.

In this embodiment, after the etching step, the second spacer 203a is formed on the PMOS gate structure side wall region, and the surface of the semiconductor substrate 200 between the PMOS gates is exposed. In some cases, gate dielectric layer 2021 between the PMOS gates is removed.

Figure 2G:
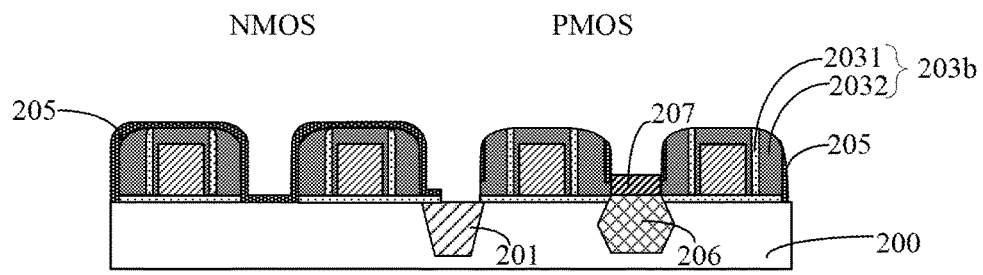

At step S308, as shown in FIG. 2G, the second photoresist layer is removed using a known method such as ashing.

Next, stress layers 206 are formed in the source/drain regions in the PMOS region. And then a cover layer 207 is formed on the stress layers. Stress layer 206 can use any material that induces a compressive stress, for example, silicon germanium (SiGe), which can improve the carrier mobility by applying a compressive stress to the channel.

In an example, the process of forming a silicon germanium layer 206 can include forming a trench or groove in the source/drain regions in the PMOS region of the semiconductor substrate. The trench is preferably formed as a Σ-type. Then, a selective epitaxial growth process can be used to form the embedded silicon germanium stress layer 206 in the trench. The selective epitaxial growth process may employ a low pressure chemical vapor deposition (LPCVD), plasma enhanced chemical vapor deposition (PECVD), ultra-high vacuum chemical vapor deposition (UHVCVD), rapid thermal chemical vapor deposition (RTCVD), and molecular beam epitaxy (MBE) process. In the present embodiment, the selective epitaxial growth process can be carried out at a low temperature in the range of 500-850° C. After forming silicon-germanium stress layer 206, a cover layer or cap layer 207 is formed on the silicon germanium stress layer 206. Cover layer or cap layer 207 can be a silicon layer or a silicon-germanium layer having a low germanium content.

Figure 2H:
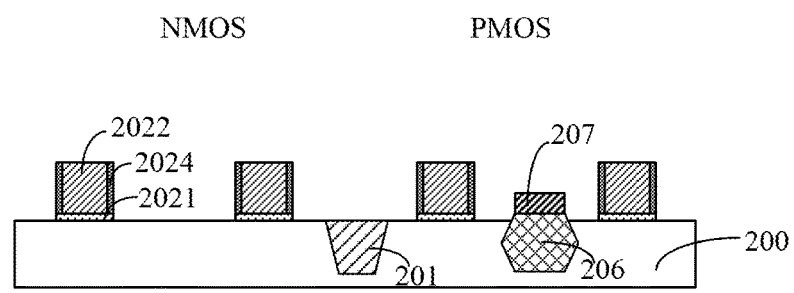

At step S309, as shown in FIG. 2H, the remaining portions of sacrificial material layer 205, first sidewall spacers 203a, and second sidewall spacers 203b are removed. As an example, a wet etching method can be used for removing the remaining sacrificial layer material 205, first spacers 203a, and second spacer 203b. For example, if silicon nitride is included in sacrificial material 205, first spacers 203a, and second spacer material 203b, it can be removed using phosphoric acid as an etching solution, at a reaction temperature ranging from 100° C. to 200° C. In one example, this step can also include the step of removing the gate hard mask layer 2023.

In the above description, certain process steps, such as source/drain implants, are omitted for simplicity. It has been illustrated that in embodiments of this invention, the SiGe stress layers in the PMOS regions and the cover layer are formed after the NMOS device region has already been formed, and subsequent removal of the sacrificial layer and the spacers are carried out by wet etching. This method can effectively avoid the overlay loss caused by a dry etching process that fails to protect the SiGe stress layer. It can ensure the integrity of the SiGe stress layer to provide compression stress in the channel to improve carrier mobility, and ultimately improve the yield and performance of the device.

Embodiments of the present invention also provide an electronic apparatus that includes the above-described SiGe device structures. The electronic apparatus can include a semiconductor device with the SiGe device structures and electronic components connected to the semiconductor device. The semiconductor device includes a semiconductor device formed using the manufacturing method described above, or a semiconductor device described above. The electronic component can include discrete devices and integrated circuits, or other electronic components.

By including the isolation pocket structure, the electronic apparatus can have excellent performance, with the advantages described above. The electronic device may include a mobile phone, tablet PCs, laptops, notebooks, game consoles, televisions, VCD, DVD, navigation, camera, video camera, voice recorder, MP3, MP4, PSP, and other electronic products or equipment. Embodiments of the present invention also provide intermediate products having the above-described semiconductor device, for example: a mobile phone motherboard that includes the integrated circuit, and the like.

While the present invention is described herein with reference to illustrative embodiments, this description is not intended to be construed in a limiting sense. Rather, the purpose of the illustrative embodiments is to make the spirit of the present invention be better understood by those skilled in the art. In order not to obscure the scope of the invention, many details of well-known processes and manufacturing techniques are omitted. Various modifications of the illustrative embodiments as well as other embodiments will be apparent to those of skill in the art upon reference to the description. It is therefore intended that the appended claims encompass any such modifications.

Furthermore, some of the features of the preferred embodiments of the present invention could be used to advantage without the corresponding use of other features. As such, the foregoing description should be considered as merely illustrative of the principles of the invention, and not in limitation thereof.

What is claimed is:

1. A method for manufacturing a semiconductor device, comprising:
    providing a semiconductor substrate, the semiconductor substrate including a PMOS region and an NMOS region, and a plurality of gate structures forming in the PMOS region and the NMOS region;
    depositing a spacer material layer overlying the plurality of gate structures and the surface of the semiconductor substrate;
    forming a first photoresist layer to cover the PMOS region and to expose the NMOS region;
    etching the exposed portion of the spacer material layer to form first sidewall spacers on the sidewalls of the gate structures in the NMOS region; removing the first photoresist layer;
    depositing a sacrificial surface layer, the sacrificial layer overlying the spacer material layer covering the PMOS region, the first sidewall spacers, and the exposed surface of the semiconductor substrate;
    forming a second photoresist layer to cover the NMOS region and to expose the PMOS region;
    etching the sacrificial material layer and the spacer material layer in the exposed PMOS region to form second sidewall spacers on the sidewalls of the gate structure in the PMOS region;
    removing the second photoresist layer; then subsequently forming stress layers in source/drain regions in the PMOS region;
    forming a cover layer on the stress layers; and then subsequently
    removing the sacrificial material layer, the first sidewall spacers, and the second sidewall spacer.

2. The method of claim 1, wherein the cover layer is not subject to plasma etching during removal of the sacrificial material layer, the first sidewall spacers, and the second sidewall spacer.

3. The method of claim 1, wherein each of the gate structures comprises a gate dielectric layer and a gate electrode layer.

4. The method of claim 1, wherein the spacer material layer comprises a nitride layer and an oxide layer.

5. The method of claim 4, wherein depositing the spacer material layer comprises a process selected from the group consisting of high temperature furnace deposition, chemical vapor deposition, physical vapor deposition, and atomic layer deposition.

6. The method of claim 4, wherein the nitride layer is deposited in a temperature range of 100° C. to 600° C.

7. The method of claim 4, wherein the nitride layer is disposed over the oxide layer.

8. The method of claim 7, wherein the thickness of the oxide layer ranges from 10 to 50 Å, and the thickness of the nitride layer ranges from 50 to 200 Å.

9. The method of claim 7, wherein etching the exposed portion of the spacer material layer comprises using a dry etch process to etch the nitride layer to stop at the oxide layer, and using a wet etch process to etch a portion of the oxide layer.

10. The method of claim 9, wherein the wet etch process comprises using dilute hydrofluoric acid etching solution having a molar concentration ranging from 0.01 to 1%.

11. The method of claim 1, wherein the sacrificial layer and the spacer material layer comprise the same material.

12. The method of claim 1, wherein removing the sacrificial material layer, the first sidewall spacers, and the second sidewall spacer comprises using a wet etch process such that the cover layer is not exposed to dry etching.

13. The method of claim 12, further comprising using phosphoric acid solution to remove remaining a portion of the sacrificial material layer, the first spacers, and the second spacers at a reaction temperature ranging from 100° C. to 200° C.

14. The method of claim 1, further comprising, before depositing the spacer material layer, forming a gate offset structure on the sidewalls of the gate and forming a gate hard mask on the top surface of the gate structure.

15. The method of claim 1, wherein the stress layer comprises silicon germanium.

16. The method of claim 1, wherein the cover layer comprises silicon.

17. The method of claim 1, wherein the sacrificial layer is deposited at a temperature of 100° C. to 600° C. and a thickness of 50 to 200 Å.

18. A method for manufacturing a semiconductor device, comprising:
    providing a semiconductor substrate, the semiconductor substrate including a PMOS region and an NMOS region, and a plurality of gate structures forming in the PMOS region and the NMOS region;
    depositing a spacer material layer overlying the plurality of gate structures and the surface of the semiconductor substrate;
    forming a first photoresist layer to cover the PMOS region and to expose the NMOS region;
    etching the exposed portion of the spacer material layer to form first sidewall spacers on the sidewalls of the gate structures in the NMOS region; removing the first photoresist layer;
    depositing a sacrificial surface layer, the sacrificial layer overlying the spacer material layer covering the remainder of the material, the first sidewall spacers, and the exposed surface of the semiconductor substrate;
    forming a second photoresist layer to cover the NMOS region and to expose the PMOS region;
    etching the sacrificial material layer and the spacer material layer in the exposed PMOS region to form second sidewall spacers on the sidewalls of the gate structure in the PMOS region;
    removing the second photoresist layer; then subsequently forming stress layers in source / drain regions in the PMOS region; forming a cover layer on the stress layers; then subsequently removing the sacrificial material layer, the first sidewall spacers, and the second sidewall spacer using a wet etch process such that the cover layer is not exposed to dry etching.

19. The method of claim 18, further comprising using phosphoric acid solution to remove a remaining portion of the sacrificial material layer, the first spacers, and the second spacers at a reaction temperature ranging from 100° C. to 200° C.

20. The method of claim 18, wherein the stress layer comprises silicon germanium.

* * * * *